United States Patent [19]
Schultz et al.

[11] Patent Number: 5,943,252
[45] Date of Patent: Aug. 24, 1999

[54] CONTENT ADDRESSABLE MEMORY

[75] Inventors: Kenneth James Schultz, Kanata; Farhad Shafai; Garnet Frederick Randall Gibson, both of Nepean, all of Canada

[73] Assignee: Northern Telecom Limited, Montreal, Canada

[21] Appl. No.: 08/923,824

[22] Filed: Sep. 4, 1997

[51] Int. Cl.[6] .................................................. G11C 15/00
[52] U.S. Cl. .................. 365/49; 365/238.5; 365/189.05; 365/239; 365/233
[58] Field of Search ................................ 365/49, 189.01, 365/230.01, 230.03, 238.5, 189.05, 239, 233

[56] References Cited

U.S. PATENT DOCUMENTS

| | | | |
|---|---|---|---|
| 5,220,526 | 6/1993 | Giles et al. | 365/49 |
| 5,289,403 | 2/1994 | Yetter | 365/49 |
| 5,428,565 | 6/1995 | Shaw | 365/49 |
| 5,450,351 | 9/1995 | Heddes | 365/49 |
| 5,546,555 | 8/1996 | Horstmann et al. | 395/417 |
| 5,596,539 | 1/1997 | Passow et al. | 365/210 |
| 5,706,224 | 1/1998 | Srinivasan et al. | 365/49 |

FOREIGN PATENT DOCUMENTS 56-51092    5/1981    Japan .

OTHER PUBLICATIONS

"Hybrid Associative Memory", A. Weinberger, IBM TDB, vol. 11, No. 12, May 1969, pp. 1744–1745.

"A 180 MHz 0.8–μm BiCMOS Modular Memory Family of DRAM and Multiport SRAM", A.L. Silburt et al., IEEE Journal of Solid–State Circuits, vol. 28, No. 3, pp. 222–232, Mar. 1993.

"A High Speed Embedded Cache Design with Non–Intrusive BIST", S. Kornachuk et al., Records of the IEEE International Workshop on Memory Technology, Design and Testing, pp. 40–45, Aug. 1994.

*Primary Examiner*—Viet Q. Nguyen
*Attorney, Agent, or Firm*—Angela C. de Wilton

[57] ABSTRACT

A content addressable memory employs a word-sliced architecture, in order to localize word match logic, and a global data bus, to convey data between the memory input/output circuitry and the plurality of word slices. Timing information is embedded in the global data bus in the form of a model global data signal. This signal interacts with two major control signals to self-time the memory. The number of major control signals is such that all possible memory states are uniquely represented, but the memory cannot power-up in an invalid or unrecoverable state. Three model timing paths are used to match the delay of the self-timing loop with that of the actual operation: one each for READ, WRITE and SEARCH.

9 Claims, 4 Drawing Sheets

CONTENT ADDRESSABLE MEMORY

TECHNICAL FIELD

The present invention relates to a content addressable memory (CAM) and in particular to a word-sliced CAM.

BACKGROUND INFORMATION

Content Addressable Memories (CAMs) are memories in which data is selected based on its contents, rather than its physical location. This function is useful for many applications, especially when performing a look-up for the purposes of mapping from a long identification word to a shorter word. This operation is required in many telecom functions, including Asynchronous Transfer Mode (ATM) address translation.

U.S. Pat. No. 5,289,403 granted to J. D. Yetter discloses a technique of providing self-timing to a CAM, using a model column and model row. The bit at the intersection of the model column and model row always misses, while all other cells in that row always match, and this generates the slowest possible mismatch condition on the model match line. This signal is then used to generate a clock for timing of subsequent events, and for qualifying all other match lines. Word-sliced architectures, control signal generation, and power-up issues are not addressed.

A paper by A. L. Silburt et al. entitled "A 180-MHz 0.8-um BiCMOS Modular Memory Family of DRAM and Multiport SRAM", IEEE J. Solid-State Circuits, vol. 28, no. 3, pp. 222–232, March 1993, describes modular embedded memory designs which employ model self-timing paths to achieve low power and duty cycle independence. These model paths comprise model decoders, model rows and model columns. CAMs are not addressed in the paper.

U.S. Pat. No. 5,596,539 granted to R. H. Passow et al. discloses a mechanism similar to that in A. L. Silburt et al., employing a model row and a model column. The model sense amplifier is unbalanced to provide additional timing margin. Again, CAMs are not addressed.

A paper by S. Kornachuk et al. entitled "A High Speed Embedded Cache Design with Non-Intrusive BIST", Records IEEE International Workshop on Memory Technology, Design and Testing, pp. 40–45, August 1994, describes a self-timing path for a combined CAM/RAM cache, comprising a model word which always misses in the slowest possible way. Word-sliced architectures, control signal generation, and power-up issues are not addressed.

SUMMARY OF THE INVENTION

It is an object of the present invention to provide an improved content addressable memory.

According to one aspect of the present invention, there is provided a content addressable memory (CAM) in which all bits of a given word are in physically adjacent columns, and all columns associated with a given bit are distributed.

For example, in the CAM, the columns are of word-sliced structure, the group of adjacent columns being associated with a word so that multiple words are occupying multiple rows thereof. The structure comprises a plurality of word slices. The CAM may further comprise a global data bus which conveys data between the word slices and data input/output circuitry. In the CAM, the word match logic is localized. Timing information is conveyed in the global data bus in the form of a model global data signal.

According to another aspect of the present invention, there is provided a CAM in which two major control signals are latched. In all possible combinations of the signals represent the three possible states of the memory, plus the inactive state. Hence, the memory will always power up into a recoverable state. The control signals interact with the model global data signal in the self-timing path.

BRIEF DESCRIPTION OF THE DRAWINGS

An embodiment of the present invention will now be described by way of example with reference to the accompanying drawings in which.

DETAILED DESCRIPTION

I. Prior Art

Figure 1:
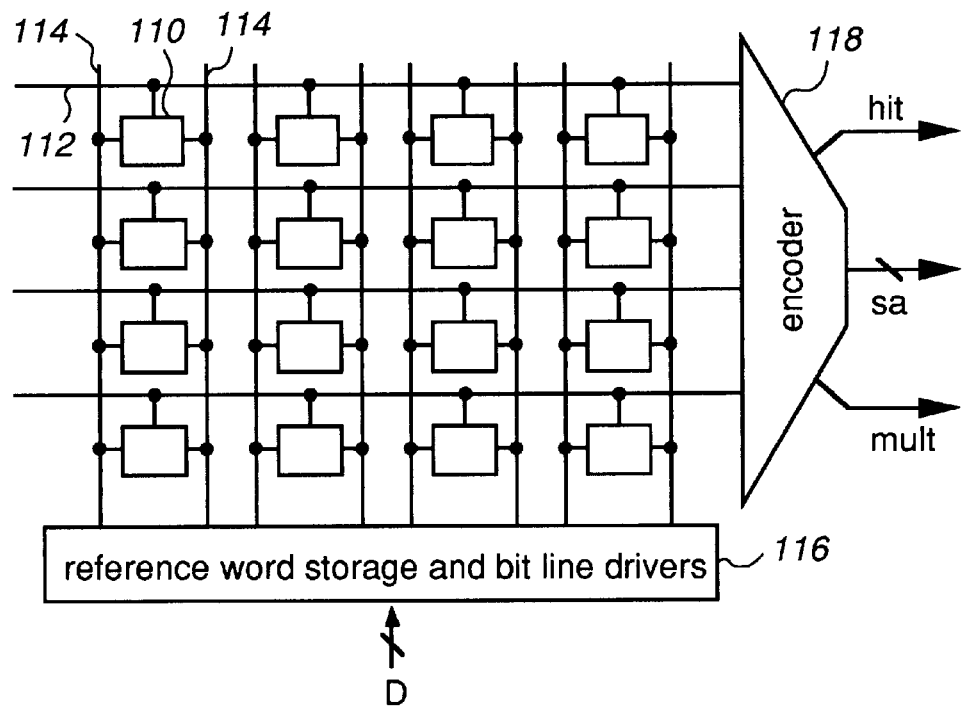
FIG. 1 illustrates a prior art CAM.

Referring to FIG. 1 which shows a prior art CAM, cells 110 belonging to a given word are connected to the match line 112 of that word in a logical NOR fashion. A pair of bit lines 114 for differential data are connected to reference word storage and bit line drivers 116 which receive input data D for loading the contents of the CAM and for the search reference word. Data stored in the array's core cells 110 are searched by applying a reference word on the bit lines 114. When differential data is asserted on a pair of bit lines 114 in a search operation, the core cell 110 compares its stored data bit with the differential data (also known as reference data, or a single bit of the comparand). When the stored data is not equal to the reference data, the core cell 110 pulls the match line 112 (which is precharged to a logical high state) down to a low state. When the stored data is equal to the reference data, the cell 110 has no effect on the match line 112 to which it is connected. Because all b core cells 110 in a given word are connected to the match line 112 in the same way, the match line 112 will be pulled low if any bit in its word is unequal to (or mismatches) the corresponding reference bit. The match line 112 remains in a logical high state only if all bits in its word are equal to the reference data.

The CAM includes an encoder 118 which produces three outputs representing the result of the search operation. A hit signal, hit, will be asserted to a logical high state, if any of the w words is storing data which has matched the reference data. The binary address of this matching word is encoded and an address signal sa is provided. In the event that a plurality of words have matched the reference data, a multi-match signal mult is asserted to a logical high state.

II. Embodiment

It is intended to design circuitry which allows the self-timing of a word-sliced CAM. Such a CAM requires a global data bus to interface between the plurality of word slices and input/output circuitry of the memory. This self-timing circuitry should:

make use of a model global data bus signal, which has known transition times and directions independent of the data pattern applied to the memory, where load and delay performance of the model line closely approximate that of an actual global data bus line;

be robust in the sense that no random power-up conditions place the memory in an unrecoverable state; and be able to self-time READ, WRITE and SEARCH operations with a minimal number of signals which are:
subject to power-up constraints, and
interacting with the model global data bus line.

Self-Timing

Self-timing is, in general, a mechanism by which a memory internally generates it own timing control signals, based solely on the rising edge of an applied system clock. Internal events may then be initiated at the optimum instant, in order to minimize delay or power, or to avoid bus contention, without reliance on external clock edges. The falling edge of the system clock usually plays no roll in timing of a self-timed memory, and operation of the memory is thus termed to be duty-cycle independent. Specifically, the termination of the active portion of the memory cycle is not initiated by the falling edge of the system clock. Because internally-generated timing signals are used to control this termination, it may be timed such that sufficient time has passed for the completion of the memory operation, but without unnecessary wasted margin that would otherwise result in increased power dissipation. In cases where actual path delays from the operation of the memory are modeled in the internal self-timing path, margins may be minimized, and the self-timing mechanism is then scaleable along with the memory configuration.

Word-Slice Architecture

Most memories, notably random access memories (RAMs), have a bit-sliced architecture, meaning that all storage cells associated with a given bit of the data word are located in contiguous adjacent columns, and a word is distributed across the entire width of a memory. An alternative architecture, employed in the CAM according to an embodiment of the invention, is one in which all bits of a given stored word are in contiguous adjacent columns, and the columns associated with a given bit of the data word are distributed across the entire width of the memory. This latter architecture is referred to as a word-sliced architecture.

Figure 2:
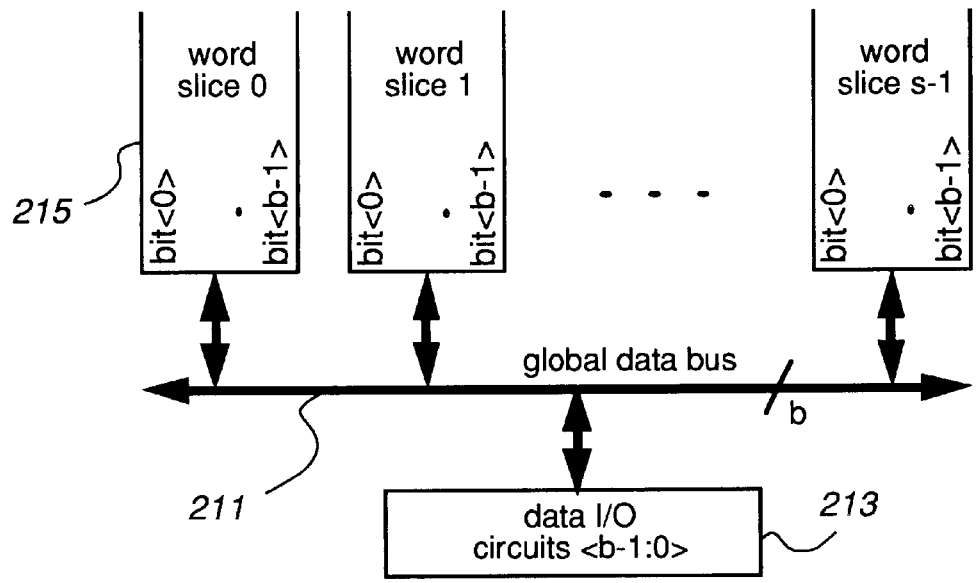
FIG. 2 illustrates a CAM according to an embodiment of the present invention.

The word-sliced architecture, shown in FIG. 2, localizes the word match operation, but requires the b bits of the comparand to be somehow conveyed to the plurality of word slices; this conveyance is accomplished with a global data bus.

In addition to SEARCH capability, the CAM also must support READ and WRITE operations. These all employ a global data bus 211. For SEARCH and WRITE operations, the direction of data propagation is from input/output (I/O) circuits to a plurality of word slices 215. For READ operations, the direction of data propagation is from the word slices to the data input/output circuits 213.

Because all operations employ the global data bus, it is advantageous to embed timing information in this bus. This is beneficial because:

the global data bus physically connects the components that need timing information, and any timing signal routed together with the bus can easily be given the same load, resulting in close matching of delays with actual data transitions.

Hence, there is provided a model global data line (on which a model global data signal, dgm, is presented) physically routed together with the global data bus, and carrying timing information as part of the memory's self-timing mechanism. The model global data line has known transition directions which are independent of applied data patterns, and is physically routed and connected to real and model loads such that its delay and transition times closely approximate those of the actual global data bus signals.

Figure 3A:
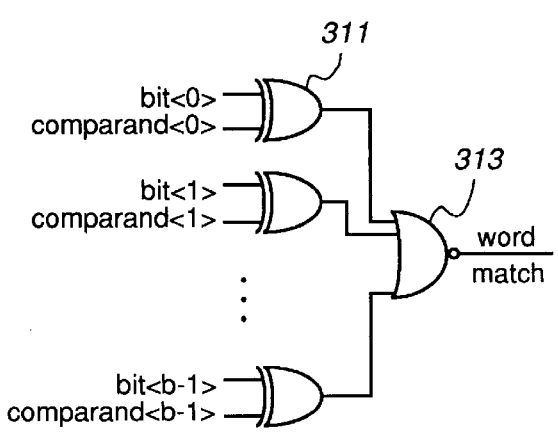
FIGS. 3A and 3B illustrate word match logic function circuits which are used in the CAM.
Figure 3B:
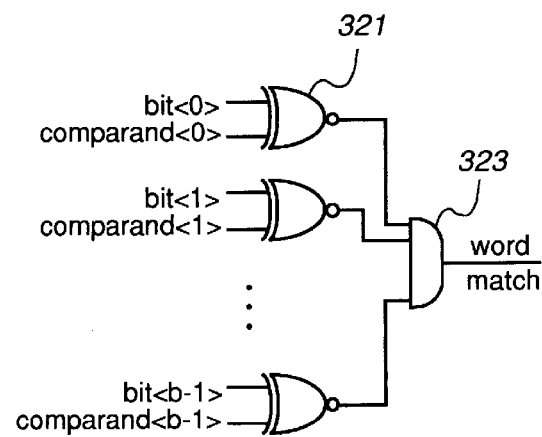

In the CAM, a word match requires that all bits in a stored word exactly match (neglecting "don't care" masks) all bits in a comparand. This requires a word-based logic operation, as shown in FIGS. 3A and 3B, and is readily implemented in a word-sliced architecture. The match logic function circuit shown in FIG. 3A includes a plurality of exclusive OR (XOR) gates 311 and a NOR gate 313. The match logic function circuit shown in FIG. 3B includes a plurality of exclusive NOR (XNOR) gates 321 and an AND gate 323.

In the CAM, all operations are initiated by a rising clock edge. Thereafter, the self-timing circuitry initiates numerous activities, based on an upwards transition on the model global data signal, dgm, which closely follows the rising edge of the system clock, and coincides with data transitions on the global data bus, such that:

during a SEARCH or WRITE, when an upward transition is completed on the model global data signal dgm at the word slices, data on the global data bus is guaranteed to be valid;

during a READ, the upward transition on the model global data signal dgm does not model any real activity on the global data bus, but its downward transition can be made to coincide with data being driven from the word slices out to the data input/output circuitry after sensing of READ result data.

In order to perform the self-timing function, the model global data signal dgm interacts primarily with two other signals, which we refer to as the major control signals: "cd" and "ca". The combined state of these control signals uniquely determines the selected operation of the memory, through the components which they enable:

cd: latches comparand or write data applied externally to the memory, and enables tri-state drivers onto the global data bus in the data input/output circuits; these functions are enabled during SEARCH and WRITE operations ca: enables address decoders during WRITE and READ operations, which:
select among the rows of the memory on the basis of x-decode bits, and
select among the word slices of the memory on the basis of z-decode bits.

The two signals cd and ca are of the minimum number required to uniquely identify the selected operation. All other "minor" control signals are generated combinationally from cd and ca.

In an embodiment, which does not limit the scope of this invention, minor control signals comprise:

cs: enables the driving of valid comparand data upwards from the global data bus at the bottom of the word slices to the memory core cells, and thereafter indirectly enables subsequent events in the SEARCH operation; cs is logically the AND of cd and NOT ca cw: enables the driving of valid write data upwards from the global data bus at the bottom of the word slices to the memory core cells during a WRITE; cw is logically the AND of cd and ca.

In a preferred embodiment, the state of cd and ca may be logically derived from three independent and mutually exclusive mode selection signals which are applied externally by the "user" or controlling processor; these signals are ss, ws, and rs, and function as follows:

TABLE I

| ss | ws | rs | cd | ca | operation |
|----|----|----|----|----|-----------|
| 0  | 0  | 0  | 0  | 0  | none      |
| 1  | 0  | 0  | 1  | 0  | SEARCH    |
| 0  | 1  | 0  | 1  | 1  | WRITE     |
| 0  | 0  | 1  | 0  | 1  | READ      |

When an operation is selected by one of the above signals, rising edges on one or both of cd and ca closely follow the rising edge of the system clock; said rising edges of cd and ca lead to the rising edge of the model global data signal dgm. At the end of the active portion of the cycle, the falling edge of the model global data signal dgm leads to the falling edges of cd and ca, resulting in a self-timing loop.

In order to maintain a representation of the state of the memory, the signals cd and ca are latched.

Immediately following the initial application of power to the memory ("power up"), all latches are in an unknown state. It is vital that the latches storing control signals power-up such that the memory is in a state from which it can easily be transitioned to a known state. If the number of possible states represented by the control signal latches, which is $2^L$ where L is the number of said latches, is greater than the number of valid states, it is possible that the memory may power-up into an invalid state. It may be impossible to transition the memory out of this state, or such a transition may only be accomplished by complex power-up-detection circuitry, which would constitute overhead in terms of both area and design complexity. In the present invention, $2^L=4$, and there are 4 possible memory states, including "none", as shown in the table above.

The model global data signal dgm must also be latched. Its state determines only whether an operation is active or complete. If the model global data signal dgm powers up in a logic low state, the memory appears as though it has completed an operation, and it will remain inactive until the application of the next rising clock edge, independent of the power-up state of cd and ca. In fact, the low state on the model global data signal dgm resets cd and ca.

If the model global data signal dgm powers up in a logic high state, the memory will proceed as though there is an ongoing operation. The type of operation is selected by the power-up state of cd and ca. The four possibilities and their outcomes are as follows:

TABLE II

| cd | ca | outcome |
|----|----|---------|
| 0 | 0 | No control signals are active, but, due to dgm = 1, the self-timing circuitry is not prepared to perform a proper cycle. One "dummy" cycle of any operation must be performed to reset the memory. Following this dummy cycle, a valid cycle may be initiated with proper control and self-timing signal transitions. |
| 0 | 1 | A READ is ongoing; it will complete with an invalid result, and the memory will reset itself into a valid state, in which it is prepared for a valid cycle. |
| 1 | 0 | A SEARCH is ongoing; it will complete with an invalid result, and the memory will reset itself into a valid state, in which it is prepared for a valid cycle. |
| 1 | 1 | A WRITE is ongoing; it will complete, and the memory will reset itself into a valid state, in which it is prepared for a valid cycle. |

The above table demonstrates the ease with which one may transition the memory into a known state, from which valid operations may be initiated. This is facilitated by the selection of latched control signals, which are sufficiently large in number to uniquely identify all valid states of the memory, but are sufficiently small in number as to be incapable of representing invalid memory states.

It was stated above that the falling edge of the model global data signal dgm, at the conclusion of the active portion of the cycle, leads to the falling edges of one or both of cd and ca (all that are in a high state), thus realizing a self-timing loop.

To accomplish this, three different model paths are provided in the CAM, one per operation. The purpose of each of these paths is to cause a falling edge on the model global data signal dgm after sufficient time has passed for the active portion of the operation to complete. This falling edge subsequently resets the cd and ca latches, this resetting further causing any asserted minor control signals to be deasserted.

The model paths are as follows:

(a) READ

Figure 4:
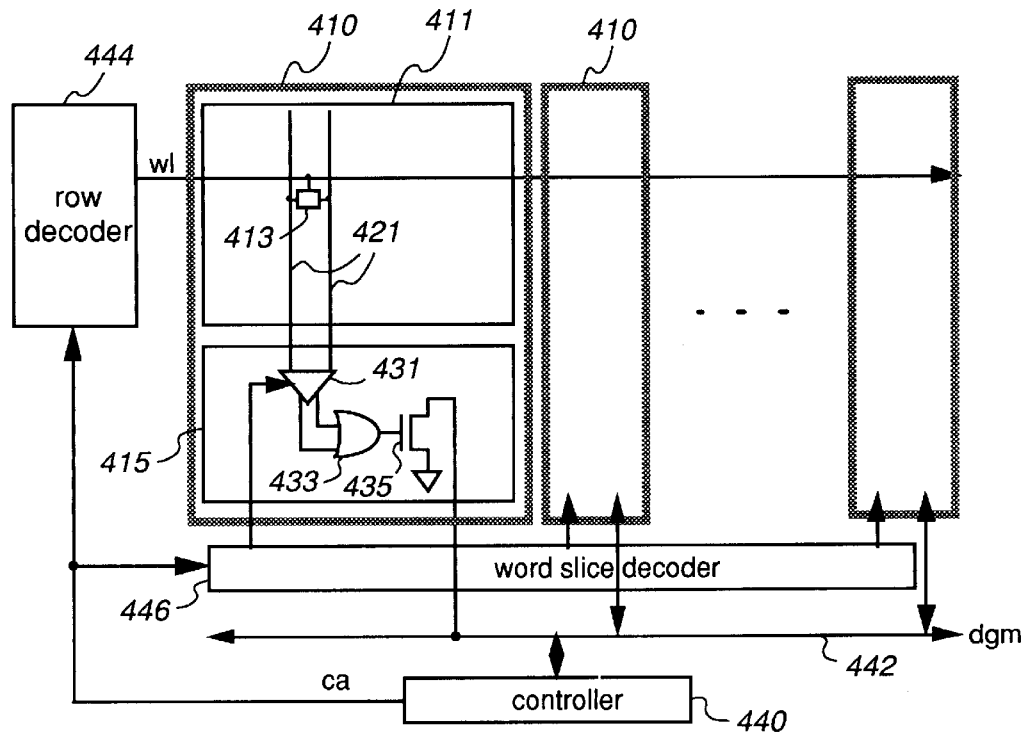
FIG. 4 illustrates a read model path.

FIG. 4 shows a read model path. Referring to FIG. 4, the word-sliced architecture includes a plurality of word slices 410, each having identical circuitry. Each word slice 410 includes an array 411 of core cells 413 and a sense circuit 415. The cells 413 of one column are connected to a pair of bit lines 421. The sense circuit 415 includes a sense amplifier 431, an OR gate 433 and a FET 435. A controller 440 connected to a model global data line 442 provides an enable signal ca to a row decoder 444 and a word slice decoder 446. The cells 413 of one row are connected to a respective word line wl which is connected to the row decoder 444. The word slice decoder 446 provides sense control signals to the sense amplifiers 431 of the sense circuits 415. The drain of the FET 435 of each sense circuit 415 is connected to the model global data line 442.

The READ loop shown in FIG. 4 makes use of a real path from the line (to which the enable signal ca is provided) to selected word line wl to the pair of bit lines 421 to the activated sense amplifier 431 in the selected word slice 410. The sense amplifier 431 is part of the actual READ operation, but in addition, its outputs (both polarities) are logically ORed by the OR gate 433, with the result used to gate the model global data line 442 pull-down by the FET 435, such that the falling edge on the model global data signal dgm occurs independently of the data polarity sensed by the sense amplifier 431.

By employing a path through the actual selected word slice, the model path closely models the delay of the real READ data on the model global data line 442.

(b) WRITE

Figure 5:
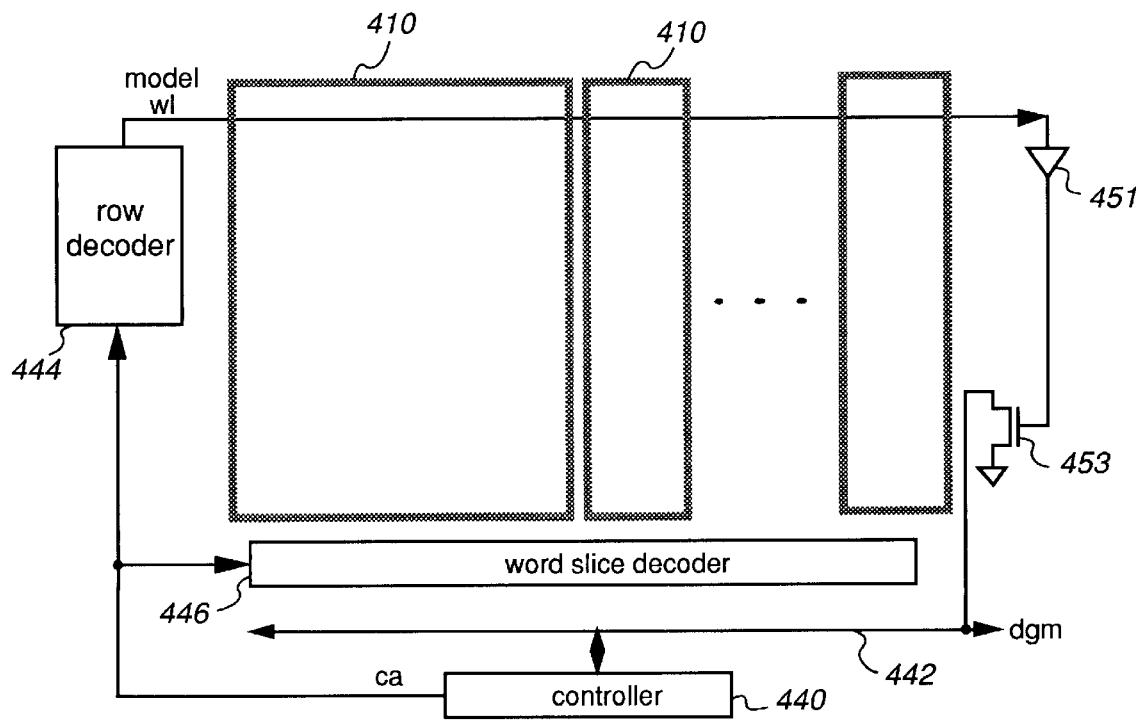
FIG. 5 illustrates a write model path.

FIG. 5 shows a write model path. Because it is difficult to derive timing information from the real storage cells which are written to within the CAM, the WRITE path shown in FIG. 5 instead employs a model wl, which loops around the memory, where it finally pulls down the model global data line 442, through a buffer 451 and a FET 453. Load on the model wl is sufficient that the falling edge on the model global data signal dgm will safely follow the completion of the active portion of the WRITE.

(c) SEARCH

Figure 6:
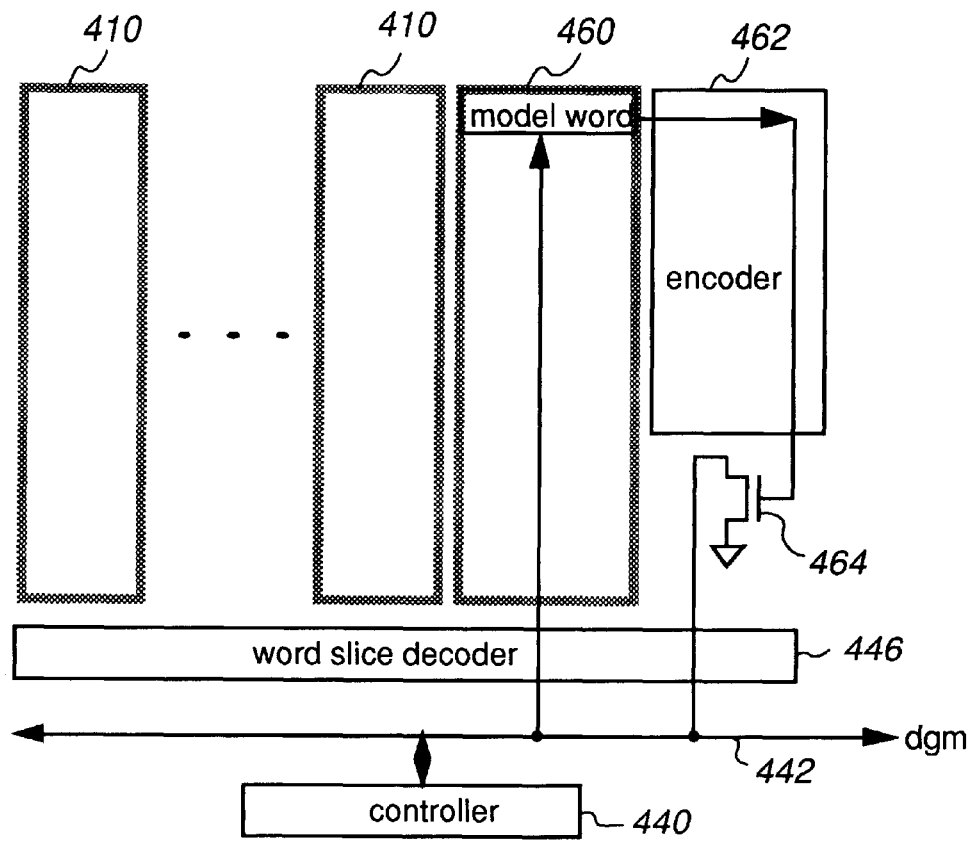
FIG. 6 illustrates a search model path.

FIG. 6 illustrates a search model path. The SEARCH path shown in FIG. 6 makes use of:

- a model word 460 which is hard-wired to always match or always mismatch, in either case in the slowest possible way,
- a path through a SEARCH result encoder 462 from this model word to a model global data line pull-down device 464, the path having a delay modeling that of actual data through the encoder 462.

The design of this model path must be such that it models the slowest possible SEARCH outcome, which will vary depending on, among other factors, the choice of match logic implementation from the alternatives shown in FIGS. 3A and 3B.

While the WRITE and SEARCH paths are activated, leading to a pull-down of the model global data line, independent of address or data, READ path functionality requires that a valid x-address and a valid z-address be selected, in order to raise a wl and activate a sense amplifier. Where this cannot be guaranteed because of unfilled (or non-binary) address spaces, a technique similar to the WRITE path may be employed, at the cost of less precise delay modeling.

It may be desirable, for characterization purposes, or in order to correct an under-margined design, to lengthen the active portion of the cycle beyond that resulting from the self-timing paths. Specifically, one may wish to control the falling edge of the model global data signal dgm with the falling edge of the system clock. This is accomplished by:

- providing an additional input signal "stov" to select this mode of operation,
- when stov is in a logic high state, pulling down the model global data line by the logical combination of stov=1 and system clock falling, and
- making the model global data line pull-downs in the above (or any other implemented) READ, WRITE, and SEARCH self-timing paths conditional on stov=0.

Figure 7:
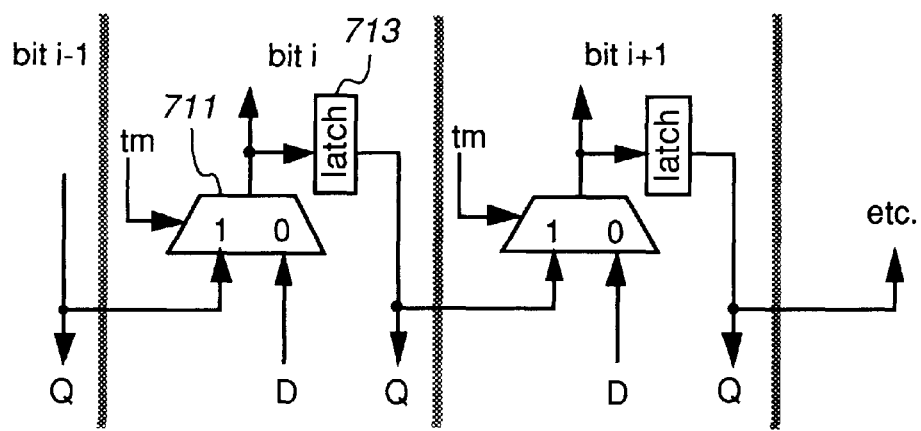
FIG. 7 illustrates a scan path in the data input/output circuitry of the CAM.

In addition to the primary mode control inputs ss, ws, rs, a test mode ("tm") input may be provided to force the CAM into a state suitable for Scan testing. If the CAM is designed such that WRITE data D is propagated through to READ output Q during a WRITE (this is termed "write through"), a Scan chain may be realized by including multiplexers in the data input/output (I/O) circuits as shown in FIG. 7, and by using tm assertion to force the CAM into a WRITE state (tm=1 leads to ca=cd=1). In FIG. 7, each I/O circuit for each bit includes a multiplexer 711 and a latch 713. The latch 713 may in actually be a latch already existent on the global data bus or otherwise. A control signal tm is fed to each multiplexer 711 (bit i) which receives a "serial data" signal bit from an I/O circuit of a lower bit (bit i−1) and a corresponding input data bit. A multiplexed output bit (bit i) is latched in the latch 713 which provides a serial data signal bit to the multiplexer of the upper bit (bit i+1).

It is understood that simple changes, including but not limited to:

- the transition directions of the model global data signal dgm,
- the number and function of input mode control signals, and
- the location of the SEARCH result encoder, control circuits, and decoders, may be undertaken by a person reasonably skilled in the art without departing from the scope of this invention.

What is claimed is:

1. A content addressable memory (CAM) in which all bits of a given word are in physically adjacent columns of word-slice structure and all columns associated with a given bit are distributed, the group of adjacent columns being associated with a word, multiple words occupying multiple rows thereof, the CAM comprising:

a global data bus for conveying data between the word slices and data input/output circuitry; and a model global data line for conveying a model global data signal having transitions corresponding to transitions of the data conveyed by the global data bus, so as to model the delay of the global data bus.

2. The CAM of claim 1, further comprising control means responsive to first and second control signals for selecting read, write and search operations of the CAM.

3. The CAM of claim 2, wherein the control means comprises means for making the model global data signal have transitions in response to the first and second control signals, the initial transition of the model global data signal initiating a transition of a given cycle initiated by an initial transition of at least one of the first and second control signals, the second transition of the model global data signal initiating the second transition of at least one of the first and second control signals.

4. The CAM of claim 3, wherein the control means further comprises:

means for driving data from the input/output circuitry to the word slices in either the write operation or the search operation in response to one of the first and second control signals; and means for decoding the data in either the write operation or the read operation in response to the other control signal.

5. The CAM of claim 3, wherein the selection of the operations is made externally by third, fourth and fifth control signals which are independent and mutually exclusive from each other, the first and second control signals being a combination of the third, fourth and fifth control signals.

6. The CAM of claim 5, wherein the control means further comprises means for propagating the data from one word slice to another in response to a sixth control signal.

7. The CAM of claim 1, further comprising a self-timing loop associated with a read operation for making use of a path from memory control circuitry to the selected word slice including sense amplifiers connected to bit lines of the word slice, the sense amplifiers being activated in the read operation, the outputs of the sense amplifiers being logically combined, so as to gate the model global data signal to perform its transition independently of the transition of the data sensed by the sense amplifiers.

8. The CAM of claim 1, further comprising a self-timing loop associated with a write operation employing a model word line, the signal of which causes the model global data signal to perform its transition after the completion of the write operation.

9. The CAM of claim 1, further comprising a self-timing loop associated with a search operation for making use of (a) a model word which is hard-wired to always match or always mismatch, in either case and (b) a path through means for encoding a search result from the model word to means for causing the model global data signal to perform its transition.

* * * * *